United States Patent
Mohieldin et al.

(10) Patent No.: US 6,646,498 B2
(45) Date of Patent: Nov. 11, 2003

(54) HIGH FREQUENCY TUNABLE FILTER

(75) Inventors: Ahmed N. Mohieldin, College Station, TX (US); Abdellatif Bellaouar, Dallas, TX (US); Sherif Embabi, Plano, TX (US); Michel Frechette, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/026,280

(22) Filed: Dec. 18, 2001

(65) Prior Publication Data

US 2003/0132797 A1 Jul. 17, 2003

(51) Int. Cl.$^7$ ............................... H03K 5/00
(52) U.S. Cl. ........................ 327/553; 327/552
(58) Field of Search ................. 327/552, 553, 327/555, 556, 557, 558, 559; 330/305, 306

(56) References Cited

U.S. PATENT DOCUMENTS

| | | | | |
|---|---|---|---|---|
| 3,789,313 A | * | 1/1974 | Sanderson | .................. 330/107 |
| 4,313,089 A | * | 1/1982 | Predina | ...................... 327/254 |
| 5,218,319 A | * | 6/1993 | Takimoto | .................... 330/257 |
| 5,345,119 A | * | 9/1994 | Khoury | ....................... 327/553 |
| 5,466,976 A | * | 11/1995 | Ichihara | ...................... 333/173 |
| 5,966,047 A | * | 10/1999 | Anderson et al. | ........... 327/565 |

* cited by examiner

Primary Examiner—Dinh T. Le
(74) Attorney, Agent, or Firm—Frederick J. Telecky, Jr.; W. James Brady, III

(57) ABSTRACT

An integrated circuit (ICT) comprising a filter (50). The filter comprises an input ($v_{in}+$) for receiving an input signal and an output (56) for producing an output signal having a frequency cutoff point. The filter further comprises at least one resistor network ($RN_1$) coupled between the input and the output. The resistor network comprises a first non-switched resistance ($R_{1.1}$) and a first resistance series connection connected in parallel with the first non-switched resistance. The first resistance series connection comprises a switched resistance ($R_{1.2}$) connected in series with a source/drain path of a switching transistor ($TRR_{1.2}$), the switching transistor having a gate for receiving a control signal. The frequency cutoff point is adjustable in response to the control signal. Additionally, the switched resistance has a first resistance and the switching transistor has an on-resistance. Further, the on-resistance is at least 20 percent of the total of the first resistance and the on-resistance.

76 Claims, 3 Drawing Sheets

HIGH FREQUENCY TUNABLE FILTER

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic circuits and are particularly directed to a tunable high frequency filter used in such circuits.

Filters are commonly used in numerous types of electronic circuits to separate extraneous and undesirable components from a signal. One issue in implementing bandpass filters relates to the precision of the location of the filter's center frequency, and another issue for bandpass as well as low and high pass filters relates to the precision of the location of the filter's cutoff frequency. Cutoff frequency is typically defined in the art as the frequency location where the gain of the filter is 3 dB less than the gain at the filter's center frequency and, therefore, is also is sometimes referred to as a filter's 3 dB point. Due to fabrication process variations, the device characteristics of the components which form the filter may vary. As a result, these variations cause the filter center frequency and cutoff frequency also to vary. Naturally, such variations are undesirable because they cause the filter to operate differently than it would at its intended center frequency and cutoff frequency.

In order to compensate for the variations in filter center frequency and cutoff frequency, it is known in the art to provide mechanisms to tune filters, sometimes referred to as the construction of a tunable filter. A tunable filter includes some sort of scheme for adjusting the filter center frequency and cutoff frequency after the filter is constructed. Typically the manufacturer of the filter uses the tuning scheme to adjust the filter toward its intended characteristics so as to overcome the process variations. While the tuning circuit therefore allows some adjustment to the filter, it also adds parasitic attributes to the filter. The parasitics may undesirably affect the pole and zero locations for the filter as well as the response shape (i.e., including the Q of the filter). More particularly, in a filter used for a relatively low frequency application on the order of a few megahertz, the RC values of the filter circuit are relatively large as compared to the parasitic values added to the filter due to the tuning circuit. As a result, the effects of the tuning circuit on the filter are typically acceptable for numerous applications. However, in a filter used for a relatively high frequency application on the order of several hundred megahertz or greater, the RC values of the filter circuit are smaller than those in the low frequency filter and, as a result, these RC values are much more influenced by the parasitic values added to the filter due to the tuning circuit. Thus, the high frequency filter is more difficult to design in view of process variations and corrective tuning circuits. In addition, for many filters a tuning circuit may consume too much power or active area relative to the filtering circuit.

In view of the above, it is recognized that various difficulties arise in constructing a high frequency filter with an acceptable manner of tuning the filter so as to overcome the effects caused on the filter's operations by process variations. Accordingly, there arises a need to address these complexities. This need is achieved by the preferred embodiments described below.

BRIEF SUMMARY OF THE INVENTION

In the preferred embodiment, there is an integrated circuit comprising a filter. The filter comprises an input for receiving an input signal and an output for producing an output signal having a frequency cutoff point. The filter further comprises at least one resistor network coupled between the input and the output. The resistor network comprises a first non-switched resistance and a first resistance series connection connected in parallel with the first non-switched resistance. The first resistance series connection comprises a switched resistance connected in series with a source/drain path of a switching transistor, the switching transistor having a gate for receiving a control signal. The frequency cutoff point is adjustable in response to the control signal. Additionally, the switched resistance has a first resistance and the switching transistor has a on-resistance. Further, the on-resistance is at least 20 percent of the total of the first resistance and the on-resistance. Other aspects are also disclosed and claimed.

DETAILED DESCRIPTION OF THE INVENTION

Figure 1:
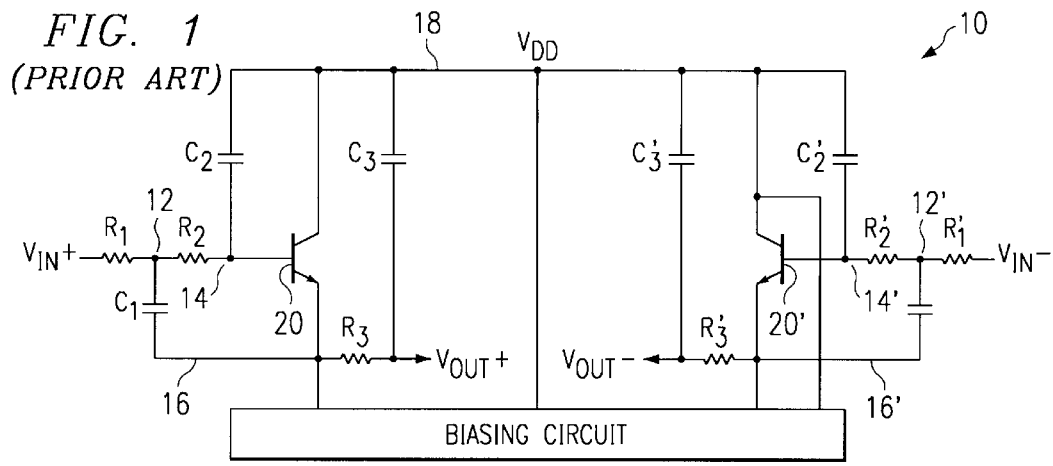
FIG. 1 illustrates a schematic of a prior art Sallen-Key filter.

FIG. 1 illustrates a schematic that includes a filter known in certain respects in the prior art and designated generally at 10, where the filter is referred to in the art as a low pass Sallen-Key filter. As detailed below and for sake of later comparison to the preferred embodiments, filter 10 is further modified by the inclusion of an additional stage to create an additional pole in the frequency response curve of the filter to meet the attenuation requirements in the stop-band. A Sallen-Key filter is very attractive for high frequency applications such as those operating at several hundred megahertz or greater. Thus, a high frequency filter is introduced here and is also implemented in the preferred embodiments by making improvements to the general schematic shown in FIG. 1. Accordingly, to better understand the improvements provided by the preferred embodiments, the following discussion first provides a better understanding of the prior art Sallen-Key filter.

Turning to the electrical details in FIG. 1, filter 10 is generally a differential filter with differential input nodes $v_{in}+$ and $v_{in}-$ and differential output nodes $v_{out}+$ and $v_{out}-$. For the sake of simplifying this text, the following discussion describes one half of the symmetric circuit in detail, while one skilled in the art will readily appreciate from the symmetric nature that comparable devices are used and connected for the other half of various aspects in the circuit.

Starting with input node $v_{in}+$, it is connected through a resistor $R_1$ to a node 12. Node 12 is connected through a resistor $R_2$ to a node 14, and node 12 is also connected through a capacitor $C_1$ to a node 16. Node 14 is connected through a capacitor $C_2$ to a node 18, where node 18 is connected to a DC supply voltage $V_{DD}$. Node 14 is also connected to the base of a bipolar junction transistor ("BJT") 20. The collector of BJT 20 is connected to node 18 and the emitter of BJT 20 is connected to node 16. Node 16 is further connected to biasing circuit 22 and through a resistor $R_3$ to output node $v_{out}+$. Additionally, output node $v_{out}+$ is connected through a capacitor $C_3$ to node 18. Lastly, note that resistor $R_3$ and capacitor $C_3$ provide the additional pole in the frequency response curve of filter 10 as introduced above and, thus, without these elements a filtered output would be provided at node 16.

Looking now to the input node $v_{in}-$ with its symmetric nature to the input node $v_{in}+$, the same reference identifier, with the addition of an apostrophe, is used for each comparable device and node connected to or through $v_{in}-$ so that each device and node may be readily appreciated as symmetric with a corresponding device and node having the same identifier with respect to $v_{in}+$. For example, input node $v_{in}-$ is connected through a resistor $R_1'$ to a node 12', and node 12' is connected through a resistor $R_2'$ to a node 14'. Node 12' is also connected through a capacitor $C_1'$ to a node 16'. Node 14' is connected through a capacitor $C_2'$ to node 18, and node 14' is also connected to the base of a BJT 20'. The collector of BJT 20' is connected to node 18, and the emitter of BJT 20' is connected to node 16', which is further connected to biasing circuit 22. The symmetric nature of the devices in FIG. 1 will therefore be readily appreciated by one skilled in the art.

The operation of filter 10 is well-known in the art to perform generally as a low pass filter, and as stated above filter 10 further includes an additional notch in its response curve. In general, a DC bias $V_{DD}$ is applied to filter 10 which is further powered by biasing circuit 22 to operate in the appropriate region to provide a low frequency filter response. To depict the overall response, Equation 1 below generally provides the filter transfer function, H(s), where the gain of the amplifier configuration of BJT 20, represented below as k, is chosen to be unity (i.e., k=1), and where Equation 1 is followed by a frequency cutoff $\omega_0$ and an additional pole frequency $\omega_1$, as well as the bandwidth (i.e., BW), as set forth in the design considerations set forth in Equations 2, 3, and 4. Additionally, the first multiplicand of Equation 1 relates to the Sallen-Key filter in general, while the second multiplicand is due to the additional pole arising from resistor $R_3$ and $C_3$:

$$H(s) = \frac{V_o(s)}{V_{in}(s)} = \frac{k}{1 + sC_2R_2 + sC_2R_1 + sC_1R_1(1-k) + s^2C_1R_1C_2R_2} \times \frac{1}{1 + sC_3R_3}$$

Equation 1

$$w_0 = \sqrt{\frac{1}{C_1C_2R_1R_2}}$$

Equation 2

$$w_1 = \sqrt{\frac{1}{C_3R_3}}$$

Equation 3

$$BW = \frac{w_0}{Q} = \frac{1}{R_1C_1} + \frac{1}{R_2C_1} + \frac{1}{R_2C_2}(1-k)$$

Equation 4

Having described filter 10 and its response, the preferred embodiments endeavor to incorporate an apparatus and method into such a filter that permits tuning the filter since the various RC products are not always well controlled in today's manufacturing technology. Further in this regard, note that although benefits are achieved in using the single unity gain amplifier of filter 10, this choice provides no active element to tune in this regard. Instead, therefore, the preferred embodiments contemplate tuning of resistance, capacitance, or both, and further do so in a manner such that the tuning circuit and more particularly the tuning switches become part of the total effective resistance of the filter.

Figure 2:
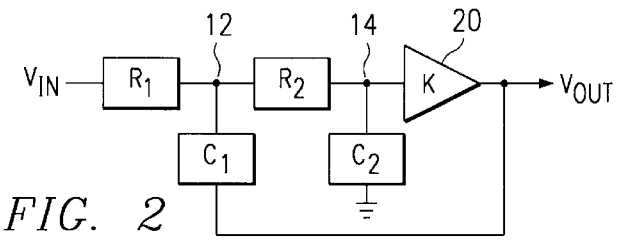
FIG. 2 illustrates a block diagram of the prior art Sallen-Key filter of FIG. 1.

To further appreciate the development of the preferred embodiments described later, FIG. 2 illustrates a block diagram of one of the two symmetric portions of the prior art filter 10 from FIG. 1 so as to facilitate later discussions about considerations for altering the prior art. Given the previous detailed discussion of filter 10 of FIG. 1, only a brief review is hereby given with respect to FIG. 2. An input node $v_{in}$ is connected through resistor $R_1$ to node 12. Node 12 is connected through resistor $R_2$ to node 14 and also through a capacitor $C_1$ to node 16. Node 14 is connected to capacitor $C_2$, and capacitor $C_2$ is shown as connected to ground in FIG. 2 because insofar as frequency response is concerned the comparable DC connection in FIG. 1 to $V_{DD}$ is effectively a ground in an AC response as shown in FIG. 2. Further, node 14 is connected to an amplifier 20 having a gain k (either unity or other) and with its output connected to node 16. For the sake of the FIG. 2 block diagram which does not include the extra circuit relating to $R_3$ and $C_3$ in FIG. 1, node 16 serves as the output node $v_{out}$.

Figure 3:
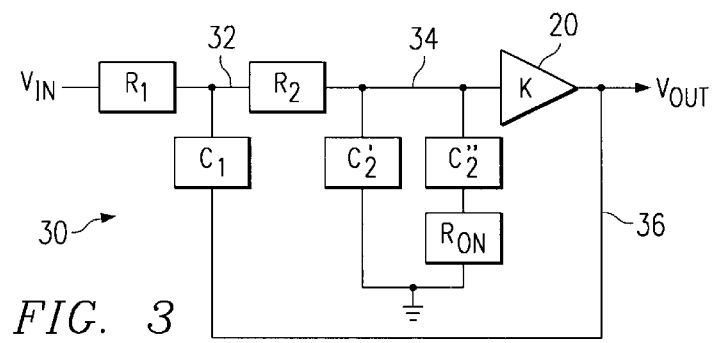
FIG. 3 illustrates a block diagram of a first alteration to the Sallen-Key filter of FIG. 2.

FIG. 3 illustrates a block diagram of a first approach to modifying filter 10 of FIG. 2 in developing the preferred embodiments, where this approach is indicated generally as a filter 30. The input node $v_{in}$ in filter 30 is connected through a resistor $R_1$ to a node 32. Node 32 is connected through a resistor $R_2$ to node 34 and also through a capacitor $C_1$ to a node 36. With respect to node 34, it is modified relative to node 14 in FIG. 2 in that capacitor $C_2$ of FIG. 2 is replaced in FIG. 3 with two capacitors: (1) a non-switched capacitor $C_2'$; and (2) a switched capacitor $C_2''$, that is, capacitor $C_2''$ has a transistor switch connected between it and ground. The additional transistor switch connected to capacitor $C_2''$ has a resistance when it is on, designated in FIG. 3 as $R_{on}$. Further $R_{on}$ is defined by the following Equation 5:

$$R_{on} = \frac{1}{\mu C_{ox}\left(\frac{W}{L}\right)(V_{GS} - V_T)}$$

Equation 5

Lastly, node 34 is connected to an amplifier 20 having a gain k and with its output connected to node 36, thereby serving as the output node $v_{out}$.

Given the alteration of filter 30 versus that of filter 10, then the transfer function of filter 30 will be shown in the following Equation 6 given two assumptions. First, assume that $R_1$ and $R_2$ have the same resistance R. Second, assume that the parallel capacitors connected to node 34 equal the value of $C_2$ from filter 10, that is, $C_2=C_2'+C_2''$. Equation 6, therefore, is as follows:

$$H(s) = \frac{1 + sR_{on}C_2''}{1 + s[2RC_2 + R_{on}C_2''] + s^2[R^2C_1C_2 + 2RR_{on}C_2'C_2''] + s^3[C_1C_2'C_2''R^2R_{on}]} \quad \text{Equation 6}$$

Further, in comparison with the ideal transfer function, it can be shown that the error in the cut-off frequency, $\Delta\omega_n$, as between filters 10 and 30, is given by the following Equation 7:

$$\frac{\Delta\omega_0}{\omega_0} = -2\frac{-C_2'}{C_1}\frac{C_2''}{C_2}\frac{R_{on}}{R} \quad \text{Equation 7}$$

Given Equation 7, for a one percent error with a resistor R on the order of a few hundreds of ohms (as is typical for a high frequency or low noise application), then the resistance $R_{on}$ would need to be in the range of a few ohms. However, such a constraint may be undesirable. For example, as known in the art, to obtain such a resistance requires a very large transistor size. Moreover, also as known in the art, the parasitic capacitance of a transistor increases with its size and, thus, a physically larger transistor having only a few ohm on-resistance gives rise to large parasitic capacitance. The large parasitic capacitances are voltage dependent and will degrade the linearity of the filter. Thus, the preferred embodiments described below further account for these observations.

Figure 4:
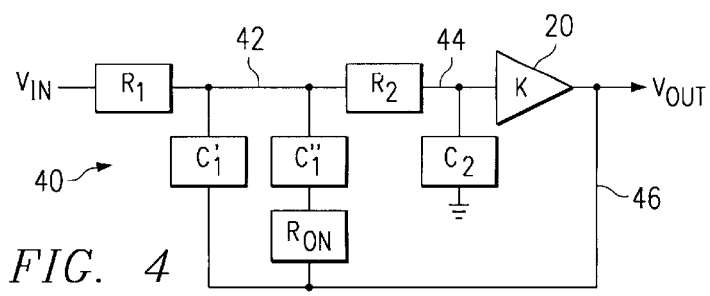
FIG. 4 illustrates a block diagram of a second alteration to the Sallen-Key filter of FIG. 2.

FIG. 4 illustrates a block diagram of a second approach to modifying filter 10 of FIG. 2, where the FIG. 4 approach is indicated generally as a filter 40. The input node $v_{in}$ in filter 40 is connected through a resistor $R_1$ to a node 42. Node 42 is connected through a resistor $R_2$ to node 44, and node 44 is also connected to an amplifier 20 having a gain k and with its output connected to a node 46. Node 46 serves as the output node, $v_{out}$, for filter 40. Returning to node 42, it is modified relative to node 14 in FIG. 2 in that capacitor $C_1$ of FIG. 2 is replaced in FIG. 4 with two capacitors: (1) a non-switched capacitor $C_1'$; and (2) a switched capacitor $C_1''$, that is, capacitor $C_1''$ has a transistor switch connected between it and node 46. The additional transistor switch connected to capacitor $C_1''$ has a resistance when it is on, designated also in FIG. 4 as $R_{on}$ and previously defined in Equation 5. Lastly, node 44 is connected through capacitor $C_2$ to an AC ground.

Given the alteration of filter 40 versus that of filter 10, then the transfer function of filter 40 will be shown in the following Equation 8, given two assumptions. Specifically, assuming that $R_1$ and $R_2$ have the same resistance R, and assuming that that the parallel capacitors connected to node 42 equal the value of $C_1$ from filter 10, that is, $C_1=C_1'+C_1''$, then Equation 8 is as follows:

$$H(s) = \frac{1 + sR_{on}C_1''}{1 + s[2RC_2 + R_{on}C_1''] + s^2[R^2C_1C_2 + 2RR_{on}C_2C_1''] + s^3[C_2C_1'C_1''R^2R_{on}]} \quad \text{Equation 8}$$

Further, it can be shown that the error in the cut-off frequency, $\Delta\omega_0$, as between filters 10 and 40, is given by the following Equation 9:

$$\frac{\Delta\omega_0}{\omega_0} = -2\frac{C_1''}{C_1}\frac{R_{on}}{R} \quad \text{Equation 9}$$

Given Equation 9, much of the same observations may be made with respect to it and filter 40 as were made with respect to Equation 7 above in connection with filter 30. Thus, again for a one percent error with a resistor R in the order of a few hundreds of ohms, then the on-resistance $R_{on}$ of the switch transistor would need to be in the range of a few ohms which likely provides an undesirable constraint. Again to obtain such a resistance required a very large transistor size which gives rise to large parasitic capacitances which therefore are voltage dependent and will degrade the linearity of the filter. Still further in the case of filter 40, note that the proposed replacement of the prior art capacitor $C_1$ with $C_1'$ and $C_1''$ creates a configuration with a floating switched capacitor $C_1''$ in contrast to the example of FIG. 3 wherein the switched capacitor $C_2''$ is connected to an AC ground. In the latter case of FIG. 4, it has been determined in connection with the preferred embodiments that a large floating parasitic capacitance is particularly undesirable because it will change the Q of the filter which also is undesirable. Thus, the preferred embodiments described below further account for these observations as well.

Figure 5:
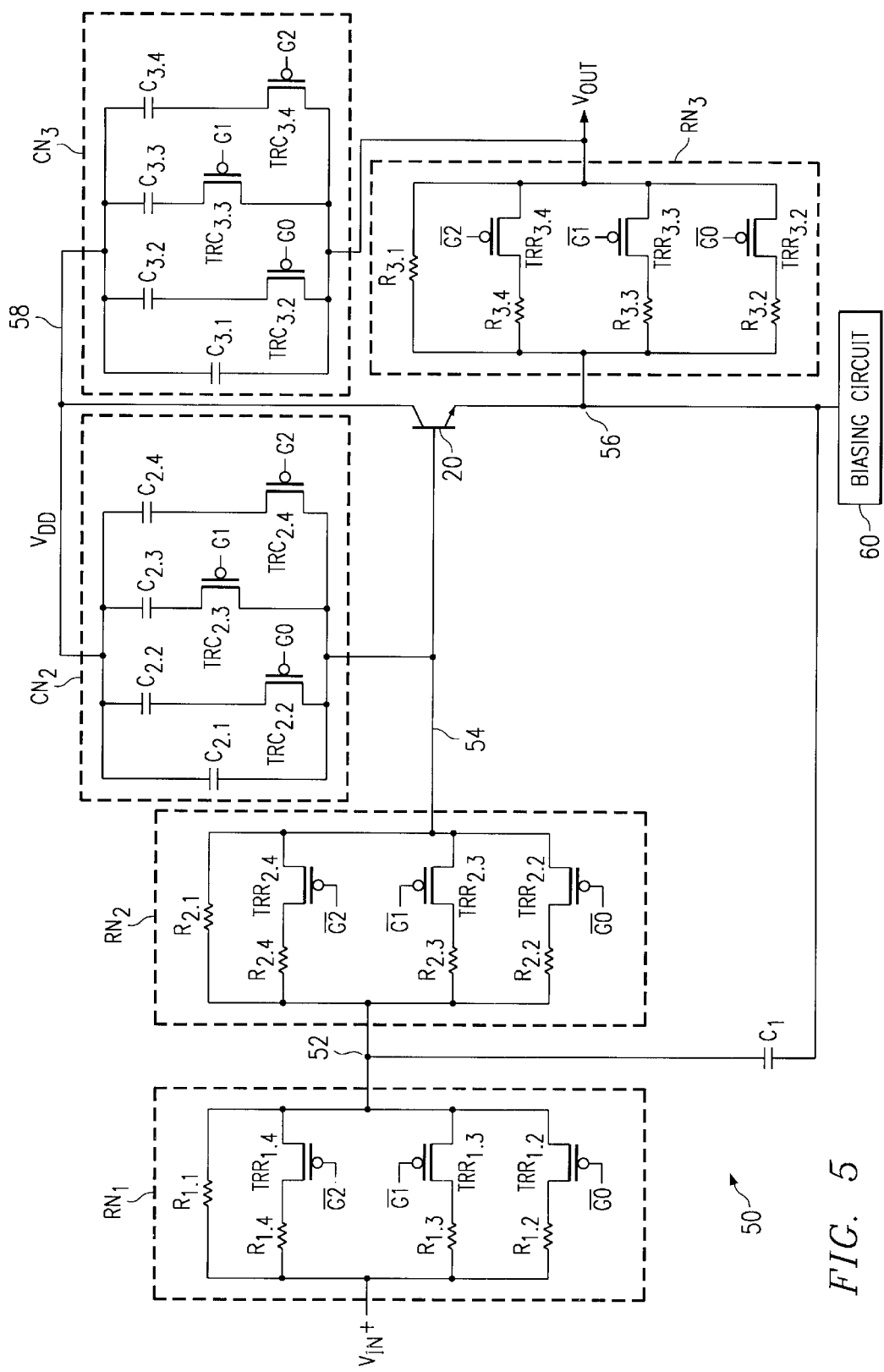
FIG. 5 illustrates a schematic of a preferred embodiment tunable filter.

FIG. 5 illustrates a schematic of a preferred embodiment filter designated generally at 50, and which is developed in view of the previous observations as well as additional factors described below. By way of introduction to various notable aspects, filter 50 preferably incorporates resistor networks in place of single resistors $R_1$ and $R_2$ described above, where these resistor networks preferably include both non-tunable and tunable resistances that are used for coarse tuning of the filter's cutoff frequency. Additionally, capacitor networks are included in place of capacitors $C_2$ and $C_3$, where these capacitor networks preferably include both non-tunable and tunable capacitances that are used for fine tuning of the filter's cutoff frequency. Lastly, the networks include some elements which may be selectively switched on by a corresponding transistor, where the on-resistance of each such transistor is non-negligible and is part of the total effective resistance for the filter and thereby also determines the filter's cutoff frequency.

Looking to the details within the schematic of FIG. 5, filter 50 includes in a general sense many of the connections described above with respect to other approaches. However, rather than using single resistors or capacitors in various locations, certain of those devices are replaced by more intricate device configurations as described below. In addition, resistor and capacitor values are selected based on considerably more complex considerations, including the on-resistance of the switching transistors in the configurations. Looking first to the general architecture of filter 50, note that it illustrates only one of what should be understood to be two symmetric portions of filter 50, where from the preceding discussion one skilled in the art should readily appreciate how the illustrated circuit may be replicated in a symmetric nature to form a differential design. Looking to the one side of the circuit as illustrated in FIG. 5, an input node $v_{in}$ is connected through resistor network $RN_1$ to a node 52. Node 52 is connected through a resistor network $RN_2$ to a node 54 and also through a capacitor $C_1$ to anode 56. Node 54 is connected to capacitor network $CN_2$, and capacitor network $CN_2$ is connected to a node 58, which receives a DC power supply $V_{DD}$. Further, node 54 is connected to the base of a BJT 20, preferably operating as an amplifier having a gain k=1. The collector of BJT 20 is connected to node 58. Biasing circuit 60 may be constructed in various fashions as ascertainable by one skilled in the art given the desired operating characteristics described below. The emitter (i.e., output) of BJT 20 is connected to node 56, and node 56 is further connected through a resistor network $RN_3$ to output node $\upsilon_{out}+$. Additionally, output node $\upsilon_{out}+$ is connected through a capacitor network $CN_3$ to node 58. As shown below, resistor network $RN_3$ and capacitor network $CN_3$ provide an additional pole in the frequency response curve of filter 50, and without these elements a filtered output (without the additional pole) would be provided at node 56.

The preceding introduces the resistor networks $RN_1$, $RN_2$, and $RN_3$ of filter 50, and those are now explored in greater detail. In the preferred embodiment, resistor networks $RN_1$ and $RN_2$ use the same connections and resistance values, so resistor network $RN_1$ is now described with it understood that the description therefore also applies to resistor network $RN_2$. In the preferred embodiments, each resistor in the resistor network is a poly resistance. Resistor network $RN_1$ includes a resistor $R_{1.1}$ connected in parallel with three resistor/transistor series connections. More particularly, the first resistor/transistor series connection consists of a resistor $R_{1.2}$ in series with the source/drain path of a transistor $TRR_{1.2}$, the second resistor/transistor series connection consists of a resistor $R_{1.3}$ in series with the source/drain path of a transistor $TRR_{1.3}$, and the third resistor/transistor series connection consists of a resistor $R_{1.4}$ in series with the source/drain path of a transistor $TRR_{1.4}$.

In the preferred embodiments, the resistances of resistors $R_{1.2}$, $R_{.3}$, and $R_{1.4}$ have the relationship shown in the following Equation 10:

$$R_{1.4} < R_{.1.3} < R_{1.2} \qquad \text{Equation 10}$$

Further, each resistor following the relationship in Equation 10 is approximately twice the resistance of the immediately smaller resistor. The actual values of resistance for resistors $R_{1.2}$, $R_{1.3}$, and $R_{1.4}$ are selected to locate the frequency cutoff at or near a desires frequency cutoff with the understanding that later tuning is applied to connect selected ones of those resistors within a parallel resistance configuration so as to converge on the desired cutoff frequency. This aspect is better appreciated from the operation description provided later.

Also in the preferred embodiments, the size represented by the ratio of width/length of the transistors $TRR_{1.2}$, $TRR_{.1.3}$, and $TRR_{1.4}$ has the relationship shown in the following Equation 11:

$$\text{size}(TRR_{1.2}) < \text{size}(TRR_{.1.3}) < \text{size}(TRR_{1.4}) \qquad \text{Equation 11}$$

Moreover, in the preferred embodiment, each transistor following the relationship in Equation 11 is approximately twice the size of the immediately smaller transistor, that is, transistor $TRR_{1.3}$ is twice the size of transistor $TRR_{1.2}$, and transistor $TRR_{1.4}$ is twice the size of transistor $TRR_{1.3}$. Further, as known in the art, a transistor's size is inversely proportional to its on-resistance. Thus, by way of example in considering Equation 11, in resistor network $RN_1$, the largest transistor $TRR_{1.4}$ has the smallest on-resistance. In addition to the preceding, note that the sizing and parameters regarding each switching transistor and the series resistor to which it is connected include yet an additional consideration in the preferred embodiments. Specifically, for each series connection of a resistor and a switching transistor, the resistance of the resistor and the on-resistance of the transistor to which it is series connected are approximately the same; in other words, the devices are formed so that when the transistor is enabled it provides approximately 50% of the series resistance while the resistor to which it is series-connected provides the remaining approximate 50% of the series resistance. Clearly, therefore, the amount of resistance provided by the on-resistance of each switching transistor in the preferred embodiments is a non-negligible amount; indeed, as detailed later this resistance is specifically anticipated as part of the overall resistance in the RC operation of filter 50 and filter 50 is tuned in response thereto. Lastly, in the preferred embodiments, each transistor in resistor networks $RN_1$, $RN_2$, and $RN_3$ is preferably a PMOS transistor operating in its linear region. PMOS devices are preferable for appropriate DC biasing.

The above addresses the resistance of those resistors in resistor network $RN_1$ that are series-connected to corresponding transistors. Given that understanding, note further in the preferred embodiment that non-switched resistor $R_{1.1}$, which is not series-connected to a corresponding resistor, preferably has a resistance that is lower than the resistance of any other combination of a resistor and the on-resistance of the transistor to which the resistor is series connected.

Due to the Equation 11 relationship of size, and also because the parasitic capacitance of a transistor is known to be directly proportional to size, then the relative parasitic capacitance of the transistors $TRR_{1.2}$, $TRR_{.1.3}$, and $TRR_{1.4}$ have the relationship shown in the following Equation 12:

$$\text{capacitance}(TRR_{1.2}) < \text{capacitance}(TRR_{.1.3}) < \text{capacitance}(TRR_{1.4}) \qquad \text{Equation 12}$$

This capacitance is noted here because the preferred embodiments further implement a tunable capacitor network $CN_2$ that is selected in part in view of this parasitic of resistor networks $RN_1$ and $RN_2$ (and also a tunable capacitor network $CN_3$ in view of the comparable parasitic of resistor network $RN_3$).

Resistor network $RN_3$ is constructed in a manner comparable to resistor network $RN_1$ described above, although the actual resistance values for the poly resistors used within the resistor network $RN_3$ are different so as to properly locate the additional frequency pole. Briefly applying the previous principles to resistor network $RN_3$, then resistor network $RN_3$ includes a resistor $R_{3.1}$ connected in parallel with three resistor/transistor series connections, where each resistor/transistor series connection consists of a resistor in series with the source/drain path of a transistor, including resistor $R_{3.2}$ in series with transistor $TRR_{3.2}$, resistor $R_{3.3}$ in series with transistor $TRR_{3.3}$, and resistor $R_{3.4}$ in series with transistor $TRR_{3.4}$. Further, all the resistors are poly resistors and the resistances of resistors $R_{3.2}$, $R_{.3.3}$, and $R_{3.4}$ have the relationship showing in the following Equation 13:

$$R_{3.4} < R_{.3.3} < R_{3.2} \qquad \text{Equation 13}$$

The size represented by the ratio of the width/length of the transistors $TRR_{3.2}$, $TRR_{.3.3}$, and $TRR_{3.4}$ have the relationship shown in the following Equation 14:

$$\text{size}(TRR_{3.2}) < \text{size}(TRR_{.3.3}) < \text{size}(TRR_{3.4}) \qquad \text{Equation 14}$$

Also as above, each resistance in Equation 12 is preferably twice the amount of the immediately lower resistance. Further, each transistor following the relationship in Equation 13 is approximately twice the size of the immediately smaller transistor. Additionally, all the transistor in resistor network $RN_3$ are preferably PMOS transistors operating in their linear region.

Having described the construction of resistor networks $RN_1$, $RN_2$, and $RN_3$ of filter 50, attention is now directed to the operation of those networks. By way of introduction, the following illustrates an additional connectivity aspect relating to control signals connected to the gates of the transistors in the resistor networks, and it also facilitates an understanding of the preferred embodiment aspects relating to the capacitor networks which are detailed after the following operation description relating to the resistor networks. Returning by way of example to resistor network $RN_1$, note now that for each series connection of a resistor and transistor, the transistor receives a differing control signal. In the example of resistor network $RN_1$, therefore, transistor $TRR_{1.2}$ receives a control signal $\overline{G0}$, transistor $TRR_{1.3}$ receives a control signal $\overline{G1}$, and transistor $TRR_{1.4}$ receives a control signal $\overline{G2}$. As a result, by altering the state of the control signals $\overline{G0}$, $\overline{G1}$, and $\overline{G2}$, each of the PMOS transistors in a resistor network may be selectively enabled or disables. As a result and as detailed below, when a network transistor is enabled by its respective control signal, it therefore creates a resistive conductive path, which thereby electrically includes its corresponding series-connected resistor into a parallel configuration with the non-switched resistor $R_{1.1}$ (as well as with any other switched-on series-connected resistors in the network). For example, when transistor $TRR_{1.2}$ is enabled and transistors $TRR_{1.3}$ and $TRR_{1.4}$ are disabled, then the series connection of $TRR_{1.2}$ and switched resistor $R_{1.2}$ is connected in parallel with non-switched resistor $R_{1.1}$. In other words, therefore, by switching a transistor on in this manner, the on-resistance of the transistor is also therefore connected in series with the corresponding resistor to which the transistor source/drain path is connected. Thus, the non-negligible on-resistance of the enabled transistor also becomes a part of the overall effective resistance for filter 50 and, therefore influences its frequency response.

Table 1 below further illustrates the eight possible state combinations of $\overline{G0}$, $\overline{G1}$, and $\overline{G2}$ and the resulting resistance in response thereto.

TABLE 1

| Combination | G2 G1 G0 | variation in RC product | change in nominal cutoff frequency, $f_{nominal}$ | effective resistance |
|---|---|---|---|---|
| 1 | 000 | −35% | 0.65 $f_{nominal}$ | 1.54 $R_D$ = $R_{1.1}$ |
| 2 | 001 | −25% | 0.75 $f_{nominal}$ | 1.33 $R_D$ = $R_{1.1}\|R_{1.2}$ => $R_{1.2}$ = 10.0 $R_D$ |
| 3 | 010 | −15% | 0.85 $f_{nominal}$ | 1.18 $R_D$ = $R_{1.1}\|R_{1.3}$ => $R_{1.3}$ = 5.0 $R_D$ |
| 4 | 011 | −5% | 0.95 $f_{nominal}$ | 1.05 $R_D$ = $R_{1.1}\|R_{1.2}\|R_{1.3}$ |
| 5 | 100 | +5% | 1.05 $f_{nominal}$ | 0.95 $R_D$ = $R_{1.1}\|R_{1.4}$ => $R_{1.4}$ = 2.5 $R_D$ |
| 6 | 101 | +15% | 1.15 $f_{nominal}$ | 0.87 $R_D$ = $R_{1.1}\|R_{1.2}\|R_{1.4}$ |
| 7 | 110 | +25% | 1.25 $f_{nominal}$ | 0.80 $R_D$ = $R_{1.1}\|R_{1.3}\|R_{1.4}$ |
| 8 | 111 | +35% | 1.35 $f_{nominal}$ | 0.74 $R_D$ = $R_{1.1}\|R_{1.2}\|R_{1.3}\|R_{1.4}$ |

The different possible effective resistances achieved by resistor network $RN_1$ are therefore illustrated in Table 1, with it understood that any switched resistor also is connected in parallel by way of a non-negligible on-resistance of the corresponding switched transistor. In addition, while Table 1 specifies devices in resistor network $RN_1$, a comparable results is achieved for resistor network $RN_2$ in the preferred embodiment since it uses the same device values as resistor network $RN_1$.

Looking to combination 1 in Table 1 by way of an example for appreciating the various combinations, it illustrates the case where each of G0, G1, and G2 equals 0. The complements of these values (i.e., $\overline{G0}$, $\overline{G1}$, $\overline{G2}$) are connected to the gates of transistors $TRR_{1.2}$, $TRR_{1.3}$, and $TRR_{1.4}$, respectively. Since each of these transistors is a PMOS transistor, then the high voltage at each respective gate does not enable the transistor. As a result, each of resistors $R_{1.2}$, $R_{1.3}$, and $R_{1.4}$ is not included within the overall effective resistance of resistor network $RN_1$. Consequently, the ultimate resistance provided by resistor network $RN_1$ in this example is the resistance provided by non-switched resistor $R_{1.1}$. Further, Table 1 depicts several variations relative to a value of "$R_D$" which is the desired, or intended, value of the resistance to be provided in filter 50. In other words, if no process variations occurred when manufacturing filter 50, then in the ideal case resistor networks $RN_1$ and $RN_2$ would be replaced by ideal resistance values each equal to $R_D$. However, the preferred embodiment is tunable so as to overcome the fact that due to process variations the actual value of resistance in filter 50 may not be as intended and, thus, $R_D$ may be approached by selecting from different available parallel combinations of $R_{1.1}$, $R_{1.2}$, $R_{1.3}$, and $R_{1.4}$. Thus, the fifth column of Table 1 illustrates what each particular combination yields relative to the ideal case of $R_D$. For example, in combination 1, when G2, G1, and G0 are each set equal to 0 (i.e., filter 50 is "tuned" in this manner), then the fifth column of Table 1 indicates that the actual resistance is that provided only by resistor $R_{1.1}$, and the value of resistor $R_{1.1}$ is 1.54 times the value of $R_D$. Also from this column, therefore, one skilled in the art can choose the appropriate values to manufacture the resistors in resistor network $RN_1$ since $R_D$ will be defined by the desired cutoff frequency for filter 50.

Table 1 also illustrates the effect on frequency cutoff in response to each different combination of the control signals G0, G1, and G2. In other words, returning again to the ideal case where device variation does not occur as a result of manufacturing, then filter 50 would have an ideal cutoff frequency at an intended frequency location; however, if the components do not match the ideal scenario, then instead, filter 50, without tuning, would provide a cutoff frequency referred to herein as $f_{nominal}$. However, the fourth column of Table 1 illustrates the effect of the tuned resistance on this nominal cutoff frequency. Thus, in the case of combination 1 in Table 1 (i.e., G0, G1, G2 all equal 0), the actual resistance provided by resistor network $RN_1$ causes an adjustment in the cutoff frequency so that it equals 0.65 $f_{nominal}$, which is therefore an adjustment to move the actual cutoff frequency to equal or approach the originally intended cutoff frequency for the filter. In other words, combination 1 of Table 1 illustrates an instance where process variations have resulted in an actual cutoff frequency of $f_{nominal}$ that is larger than what was intended, but by tuning each of G0, G1, and G2 to equal 0, then the resulting cutoff frequency is reduced by 0.65. Another way of stating this result is as shown in the third column of Table 1, which demonstrates that combination 1 is the preferable tuning to reduce the otherwise-existing RC product of filter 50, as it results from the manufacturing process, by 35%. Note also that by indicating an amount of correction, Table 1 assumes that $R_{1.1}$ through $R_{1.4}$ are the values as intended when manufactured; however, even if process variations cause these devices to vary in their resistance, compensation is available for the variation by tuning the devices using the appropriate control signals.

As an additional observation with respect to the preceding example and also as applying in later examples, recall that non-switched resistor $R_{1.1}$ preferably has the smallest resistance connected between the input node $v_{in}+$ and node 52, as compared to any other combination of a transistor on-resistance and the series resistor connected to that transistor. As a result, this helps enhance the linearity performance of filter 50 because resistor $R_{1.1}$, as the smallest resistance in a parallel configuration of resistances, is the most influential resistance in resistor network.

Looking to combination 2 in Table 1 by way of another example for appreciating the various combinations, it illustrates the case where the sequence of G0, G1, and G2 equals the binary value 100. As a result of receiving the complements of these voltages at their gates, transistors $TRR_{1.3}$ and $TRR_{1.4}$ are disabled, while transistor $TRR_{1.2}$ is enabled. As a result, and as shown in the fifth column of Table 1, the resistance of resistor network $RN_1$ as provided by resistive elements is provided by the parallel combination of $R_{1.1}$ with $R_{1.2}$. However, note that in addition to the resistance from resistive elements, in this case and in others when one or more transistor in the resistor network are enabled, the total effective resistance is further influenced by the non-negligible on-resistance of each enabled transistor. Thus, in the present example, the on-resistance of transistor $TRR_{1.2}$ is series-connected to switched resistor $R_{1.2}$, and that series connection is in parallel with non-switched resistor $R_{1.1}$. This tuning result causes a 25% reduction in what the cutoff frequency otherwise would be without such tuning. The remaining examples of Table 1 should therefore be readily appreciated by one skilled in the art.

Having now introduced the operation of filter 50, one skilled in the art may further appreciate the above-described preference of providing an approximate 50% contribution of resistance by the on-resistance of each transistor and a 50% contribution of resistance by the corresponding series-connected resistor. Specifically, the selection on the order of a 50% mix is preferred as a trade-off between two factors. First, if the switching transistor is too small and hence provides a larger on-resistance, then it will eventually degrade the total linearity performance of filter 50. Second, if the transistor is too large and hence provides lesser on-resistance, then the larger transistor will provide a large parasitic capacitance and thereby negatively affect the performance of filter 50. Thus, the 50% selection stated above represents a balancing of these two trade-offs. In alternative systems and possibly for different manufacturing processes, however, note that these tradeoffs may weigh toward a different balance between the contributions of resistance from the switching transistor and resistor. Thus, the present inventive scope contemplates a greater range, such as from a resistance contribution of the resistor from approximately 20 to 80% with a corresponding resistance contribution of the transistor from approximately 80 to 20%. Going beyond these limits, and particularly in the case of lowering the on-resistance of the transistor below approximately 20%, will likely introduce an unacceptably large amount of parasitic capacitance into the overall device as configured in FIG. 5.

Figure 6:
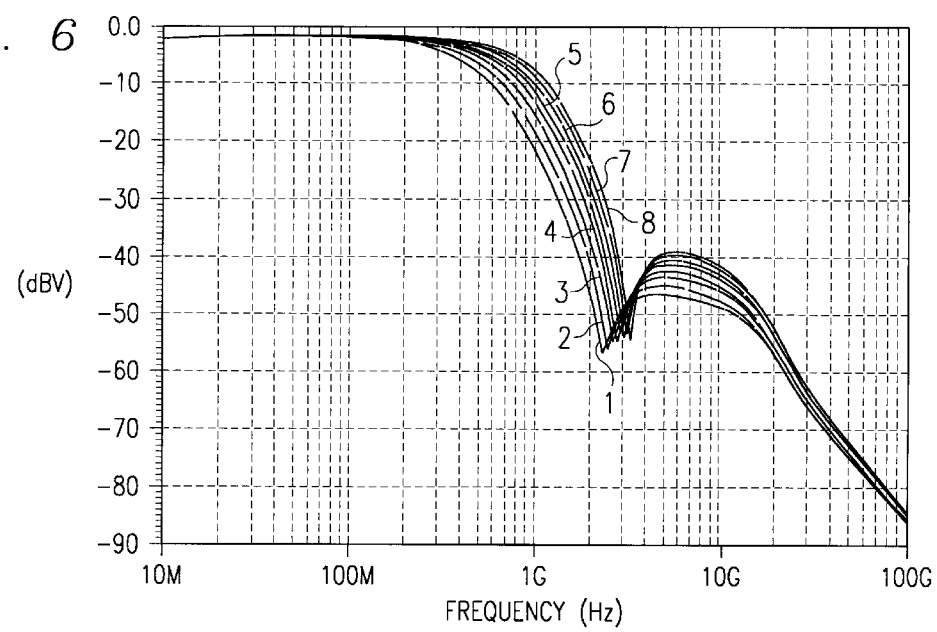
FIG. 6 illustrates a plot of frequency response curves of the filter of FIG. 5 in response to differing states of the tuning control signals.

Having now detailed the operation of resistor network $RN_1$, note that the preceding operational description also applies to comparably connected resistor networks $RN_2$ and $RN_3$. Indeed, given the use of the same control signals G0, G1, and G2, one skilled in the art should readily appreciate how the fifth column Table 1 may be modified to designate the effective parallel connection in resistor networks $RN_2$ and $RN_3$ provided in response to each of the eight different combinations of those control signals. Given the preceding, therefore, one skilled in the art should appreciate that by tuning resistor networks $RN_1$, $RN_2$, and $RN_3$ with control signals G0, G1, and G2, the cutoff frequency as well as the additional pole frequency for filter 50 may be moved a considerable amount. To further illustrate this aspect, FIG. 6 illustrates the alternative frequency response plots provided by filter 50 as a result of each of the different control signal combinations in Table 1, where in FIG. 6 each plot is labeled with the corresponding combination number from Table 1. These plots therefore demonstrate that by altering the control signals, the 3 dB frequency may be moved in a range roughly between 400 through 800 MHz. Taking into account the output resistance, $R_{out}$, of BJT 20 results in parasitic zeroes as shown in FIG. 6. It can be shown that the frequency, $\omega_z$, of the parasitic zeroes is given by the following Equation 15:

$$\omega_Z = \omega_0 \sqrt{\frac{R_D}{R_{Out}}} \qquad \text{Equation 15}$$

Given Equation 15, the effect of the parasitic zeroes is more prominent with a resistor $R_D$ on the order of a few hundreds of ohms (as is typical for a high frequency application). Careful design is needed to locate those parasitic zeroes as far as possible, by reducing $R_{out}$, to meet the attenuation requirements in the stop-band (more than 2.5 GHz in the present example as shown in FIG. 6).

While the preceding has demonstrated in detail the flexibility of tuning filter 50 by selectively enabling transistors in resistor networks $RN_1$, $RN_2$, and $RN_3$, recall also that preferably filter 50 further includes tunable capacitor networks $CN_2$ and $CN_3$. Before detailing these networks, however, note first that the preferred embodiment of filter 50 includes a capacitor $C_1$ which is not replaced by a capacitor network, that is, capacitor $C_1$ does not include one or more switched capacitors. This preference arises from the observation made earlier with respect to filter 40 of FIG. 4, that is, if capacitor $C_1$ were replaced with one or more switched capacitors, then the result would present floating parasitic capacitance which can affect the Q of the filter. Such variance is undesirable and, hence, in the preferred embodiment of filter 50 no switched capacitor is used for capacitor $C_1$. However, if one skilled in the art were to find this variance acceptable, then certainly the teaching of a capacitor network such as capacitor networks $CN_2$ and $CN_3$ also could be used in lieu of capacitor $C_1$.

The tunable capacitor network $CN_2$ is now explored in greater detail. Capacitor network $CN_2$ includes a capacitor $C_{2.1}$ connected in parallel with three capacitor/transistor series connections. More particularly, the first capacitor/transistor series connection consists of a capacitor $C_{22}$ in series with the source/drain path of a transistor $TRC_{2.2}$, the second capacitor/transistor series connection consists of a capacitor $C_{2.3}$ in series with the source/drain path of a transistor $TRC_{2.3}$, and the third capacitor/transistor series connection consists of a capacitor $C_{2.4}$ in series with the source/drain path of a transistor $TRC_{2.4}$. Preferably, each capacitor in capacitor networks $CN_2$ and $CN_3$ is preferably a PMOS transistor operating in its linear region. Each of the capacitors in capacitor network $CN_2$ may be formed using one of various different semiconductor fabrication techniques. Preferably, the capacitance of the switched-capacitors $C_{2.2}$, $C_{2.3}$, and $C_{2.4}$, as well as the non-switched capacitor $C_{2.1}$, have the relationship shown in the following Equation 16:

$$C_{2.2} < C_{2.3} < C_{2.4} < C_{2.1} \qquad \text{Equation 16}$$

Attention is now directed in more detail to the amount of capacitance provided by each capacitor in Equation 16. In the preferred embodiment, the amount of capacitance selected for the non-switched capacitor $C_{2.1}$ is directed generally to providing the desired frequency response for the cutoff frequency, $\omega_0$, for filter 50, as shown in FIG. 6 in the range of 400 to 800 MHz. However, with respect to each of the switched-capacitors $C_{2.2}$, $C_{2.3}$, and $C_{2.4}$, the amount of capacitance selected for each such capacitor is established as an offset in view of the parasitic capacitance provided by the counterpart switching transistors in resistor networks $RN_1$ and $RN_2$. More specifically, note first that the gate control signals for the capacitor-connected transistors $TRC_{2.2}$, $TRC_{2.3}$, and $TRC_{2.4}$ are the complements of the signals received by resistor-connected transistors $TRR_{2.2}$, $TRR_{2.3}$, and $TRR_{2.4}$, that is, capacitor-connected transistors $TRC_{2.2}$, $TRC_{2.3}$, and $TRC_{2.4}$ receive the signals G0, G1, and G2, respectively. As a result, the switched capacitors in the capacitor networks are included/excluded in a complementary fashion relative to the switched resistors in the resistor networks. For example, when resistor-connected transistor $TRR_{2.2}$ is enabled, then capacitor-connected transistor $TRC_{2.2}$ is disabled. This complementary setup is provided in the preferred embodiment so that, in an approximate sense, when a resistor-connected transistor is enabled and thereby presents an additional parasitic capacitance to node 52, then a counterpart capacitor-connected transistor may be disabled from node 54, thereby removing the capacitor to which it is connected from the overall RC product of filter 50. Continuing with the immediately-preceding example, therefore, when resistor-connected transistor $TRR_{2.2}$ is enabled and capacitor-connected transistor $TRC_{2.2}$ is at the same time disabled, the result of disabling capacitor-connected transistor $TRC_{2.2}$ is that capacitor $C_{2.2}$ is not then connected in parallel to non-switched capacitor $C_{2.1}$. Further, in the preferred embodiment, it is observed that node 52 will experience comparable parasitic capacitance contributed from the enabled resistor-connected transistors in both of resistor networks $RN_1$ and $RN_2$. As a result, the capacitive values for capacitors $C_{2.2}$, $C_{2.3}$, and $C_{2.4}$ are preferably selected to offset approximately the same amount of capacitance that is provided to node 52 given a state of G0, G1, and G2. For example, where the sequence G0, G1, and G2 equals the binary value 100, then in resistor network $RN_1$ only resistor-connected transistor $TRR_{1.2}$ is enabled and in resistor network $RN_2$ only resistor-connected transistor $TRR_{2.2}$ is enabled. At the same time within capacitor network $CN_2$, capacitor-connected transistor $TRC_{2.2}$ is disabled which thereby removes capacitor $C_{2.2}$ from a parallel connection within capacitor network $CN_2$ (while the other capacitor-connected transistors therein are enabled). In view of this offset aspect, in the preferred embodiments the capacitance of capacitor $C_{2.2}$ is selected to be approximately equal to the total on-capacitance provided by both resistor-connected transistors $TRR_{1.2}$ and $TRR_{2.2}$. A comparable capacitance selection is made for the remaining capacitors in capacitor network $CN_2$, so that each switched-capacitor therein has a comparable capacitance to the complementary-operating counterpart transistors in resistor networks $RN_1$ and $RN_2$, as summarized in the following Table 2:

TABLE 2

| Capacitor | Resistor-connected transistors with combined on-capacitance of comparable value |
|---|---|
| $C_{2.2}$ | $TRR_{1.2}$ and $TRR_{2.2}$ |
| $C_{2.3}$ | $TRR_{1.3}$ and $TRR_{2.3}$ |
| $C_{2.4}$ | $TRR_{1.4}$ and $TRR_{2.4}$ |

In the preferred embodiment, capacitor network $CN_3$ is generally constructed with the same number and type of components as capacitor network $CN_2$, described above. Briefly, therefore, capacitor network $CN_3$ includes a capacitor $C_{3.1}$ connected in parallel with three capacitor/transistor series connections: (1) a capacitor $C_{3.2}$ in series with the source/drain path of a transistor $TRC_{3.2}$; (2) a capacitor $C_{3.3}$ in series with the source/drain path of a transistor $TRC_{3.3}$; and (3) a capacitor $C_{3.4}$ in series with the source/drain path of a transistor $TRC_{3.4}$. The capacitance of the switched-capacitors $C_{3.2}$, $C_{3.3}$, and $C_{3.4}$, as well as the non-switched capacitor $C_{3.1}$, have the relationship shown in the following Equation 17:

$$C_{3.2} < C_{3.3} < C_{3.4} < C_{3.1} \qquad \text{Equation 17}$$

The capacitance of each capacitor in capacitor network $CN_3$ is generally provided in the same manner as the capacitors of capacitor network $CN_2$, with the differences being that the amount of capacitance selected for the non-switched capacitor $C_{3.1}$ is directed generally to providing the desired additional pole in the frequency response for filter 50, and the capacitance value for each switched capacitor in capacitor network $CN_3$ is selected as a counterpart to the parasitic capacitance provided by the transistors in resistor network $RN_3$. Looking in more detail to the switched capacitors, and similar to the earlier discussion for capacitor network $CN_2$, for the case of capacitor network $CN_3$ the gate control signals for the capacitor-connected transistors $TRC_{3.2}$, $TRC_{3.3}$, and $TRC_{3.4}$ are the complements of the signals received by resistor-connected transistors $TRR_{3.2}$, $TRR_{3.3}$, and $TRR_{3.4}$. Thus, with respect to each of the switched-capacitors $C_{3.2}$, $C_{3.3}$, and $C_{3.4}$, the amount of capacitance selected for each such capacitor is established as an offset in view of the parasitic capacitance provided by the switching transistors in resistor network $RN_3$. Further, because the output node $\upsilon_{out}+$ only has one set of transistors connected to it in contrast to the two sets as was the case for node 52, then the amount of capacitance selected for each of the switched-capacitors $C_{3.2}$, $C_{3.3}$, and $C_{3.4}$ is set approximately equal to the capacitance of the single counterpart resistor-connected transistor that is enabled when the corresponding capacitor-connected transistor is disabled. For example, where G0, G1, And G2 equal 100, then in resistor network $RN_3$ only resistor-connected transistor $TRR_{3.2}$ is enabled, and at the same time within capacitor network $CN_3$, capacitor-connected transistor $TRC_{3.2}$ is disabled which thereby removes capacitor $C_{3.2}$ from the parallel connection. Accordingly, the capacitance of capacitor $C_{3.2}$ is selected to be approximately equal to the on-capacitance provided by resistor-connected transistor $TRR_{3.2}$. A comparable capacitance selection is made for the remaining capacitors in capacitor network $CN_3$, so that each switched-capacitor therein has a comparable capacitance to the counterpart transistor in resistor network $RN_3$, as summarized in the following Table 3:

TABLE 3

| Capacitor | Resistor-connected transistor with on-capacitance of comparable value |
| --- | --- |
| $C_{3.2}$ | $TRR_{3.2}$ |
| $C_{3.3}$ | $TRR_{3.3}$ |
| $C_{3.4}$ | $TRR_{3.4}$ |

Given the preceding, one skilled in the art should therefore appreciate that capacitor networks $CN_2$ and $CN_3$ provide further adjustment of the cutoff and additional pole frequencies as they result from the semiconductor fabrication of filter 50. However, in filter 50, the majority of range in the adjustability of cutoff and additional pole frequency arises from the ability to adjust the resistor networks $RN_1$, $RN_2$, and $RN_3$ and for this reason those adjustments are earlier stated to be coarse adjustments. Additionally, additional adjustability of the cutoff and-additional pole frequency arises from the ability to adjust the capacitor networks $CN_2$ and $CN_3$, and for this reason those adjustments are earlier stated to be fine adjustments.

Figure 7:
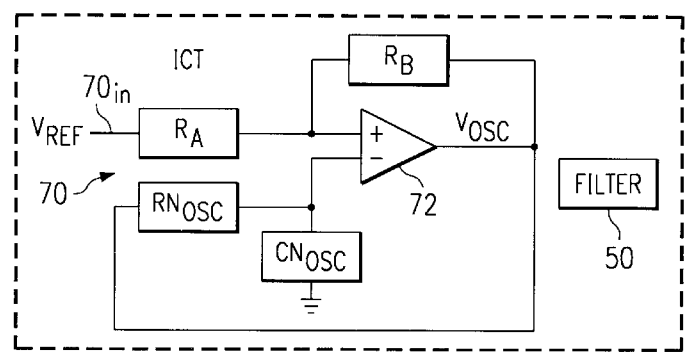
FIG. 7 illustrates an electrical block diagram of an oscillator constructed with the filter of the preferred embodiment for determining an optimal tuning for the filter.

Having detailed filter 50 and the aspect that its 3 dB frequency may be adjusted by selecting a state for the control signals G0, G1, and G2, the following discussion now examines the preferred approach for determining the best selection for these control signals. In this regard, attention is directed to FIG. 7 which illustrates an electrical block diagram of an oscillator 70. In the preferred embodiment, oscillator 70 is built on the same integrated circuit ICT that includes filter 50 and, thus, filter 50 is also shown in block form in FIG. 7 within the boundary of ICT. As a result of this preference, the manufacturing process variations and environmental factors that affect filter 50 also should affect oscillator 70. This intended effect permits a sampling of the operation of oscillator 70 so as to tune the tunable devices in filter 50, as further explored below.

Looking first to the construction of oscillator 70, it includes an input $70_{in}$ for reciting a reference voltage, $\upsilon_{ref}$. Input $70_{in}$ is connected through a resistor $R_A$ to a non-inverting input of an amplifier 72, and amplifier 27 provides an oscillator output signal $\upsilon_{osc}$. $\upsilon_{osc}$ is connected in a feedback manner through a resistor $R_B$ to the non-inverting input of amplifier 72. The combination of these connections relating to resistors $R_A$ and $R_B$ provides a bistable multivibrator with a duty cycle established by the values of resistors $R_A$ and $R_B$. Continuing with the remaining connections of oscillator 70, $\upsilon_{osc}$ is also connected in a feedback manner through a resistor network $RN_{osc}$ to the inverting input of amplifier 72. Additionally, the inverting input of amplifier 72 is connected through a capacitor network $CN_{osc}$ to ground. The RC combination of $RN_{osc}$ and $CN_{osc}$ determine the frequency of $\upsilon_{osc}$. Further, in the preferred embodiment, both resistor network $RN_{osc}$ and capacitor network $CN_{osc}$ are formed in the same manner as any one of the resistor and capacitor networks, respectively, used in filter 50, with the actual resistance and capacitance values in resistor network $RN_{osc}$ and capacitor network $CN_{osc}$ being at a known scaling of the resistive or capacitive values in the selected resistor and capacitor networks, respectively, used in filter 50. For example, resistor network $RN_{osc}$ of oscillator 70 may be formed in the same manner as resistor network $RN_1$ of filter 50, while capacitor network $CN_{osc}$ of oscillator 70 may be formed in the same manner as capacitor network $CN_2$ of filter 50, where the resistances and capacitances are the same values or with some factor of scaling such that the resistances and capacitances in networks $RN_{osc}$ and $CN_{osc}$ are a multiple of those in $RN_1$ and $CN_2$, respectively. Due to the comparable formation of networks $RN_{osc}$ and $CN_{osc}$, they too will therefore include a single fixed device (i.e., either resistor or capacitor) in parallel with a number of switched like devices.

Figure 8:
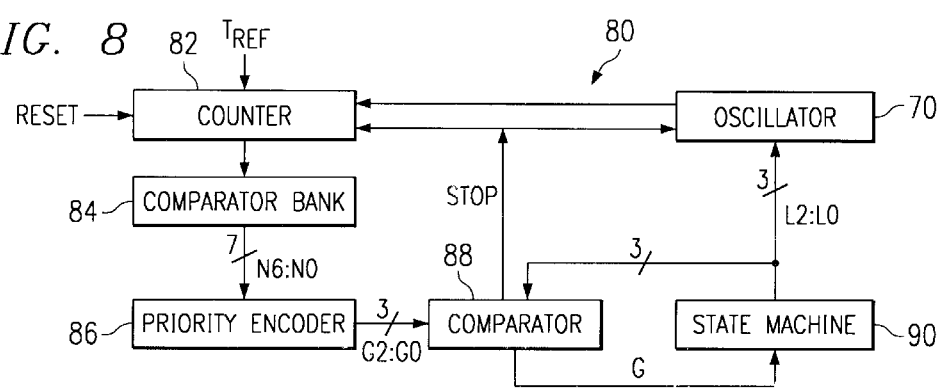
FIG. 8 illustrates a system for determining the variance in the expected output frequency of the oscillator of FIG. 7 for producing a set of control signals for the optimal tuning of the filter in FIG. 5.

Given the construction of oscillator 70, and with the knowledge of the intended values of the resistances and capacitances in networks $RN_{osc}$ and $CN_{osc}$ (as determined by the known scaling), then $\upsilon_{osc}$ will have a frequency value which is to be expected should there be no manufacturing variation or environmental influence on the resistance and capacitance in networks $RN_{osc}$ and $CN_{osc}$. As shown below, therefore, in the preferred embodiment the frequency of $\upsilon_{osc}$ is examined and, if it varies from its intended value, then that variance is assumed to be due to manufacturing variation (and the parasitics in networks $RN_{osc}$ and $CN_{osc}$ or environmental influence). Moreover, an amount of correction, implemented by adjusting the control signals to the transistor switches within networks $RN_{osc}$ and $CN_{osc}$, is determined that is sufficient to reduce the variance of $\upsilon_{osc}$ from its expected value, and that same amount of correction is then applicable to the resistor and capacitor networks in filter 50. In other words, it is assumed that the variation in oscillator 70 is the same as it is in filter 50 and, thus, by determining an amount of tuning correction for oscillator 70, that same amount of correction is preferably applied to filter 50. Additional details of this procedure are provided below FIG. 8 illustrates a block diagram of a system 80 for determining the best control code G0, G1, and G2 by analyzing $\upsilon_{osc}$ from oscillator 70, recalling that once the determination is made the same sequence is thereafter used for tuning filter 50. System 80 includes a counter 82 that counts the cycles from oscillator 70, where the count begins in response to a RESET signal and continues for a period indicated by a $T_{ref}$ signal. The count is output from counter 82 to a comparator bank 84. Comparator bank 84 includes a number of comparators, where each comparator stores a different number based on the range of anticipated counts to be expected given an anticipated variation range in the RC constant of oscillator 70, such as ±35% in the present example. By way of example, assume that comparator bank 84 includes seven comparators, each storing a respective count $n_0$ through $n_6$. Each comparator output, N0 through N6, of comparator bank 84 is connected to a priority encoder 86. Priority encoder 86 determines, from the results of each comparison detected by bank 84, a suitable state for each of the control bits in an effort to compensate for the detected process variation as further detailed below; further, these bits are output as a 3-bit control code. In the present example, the truth table for this operation is as shown in the following Table 4, where N6 through N0 are again the outputs of comparator bank 84, and G2 through G0 are the resulting three bits of the 3-bit control output by priority encoder 86. Further assume that the value of the RC product of the resistances and capacitances in networks $RN_{osc}$ and $CN_{osc}$ varies from its intended value, due to manufacturing variation by +35%. The cycles from oscillator 70 will be minimum and will be detected by counter 82. The count n from counter 82 is output to comparator bank 84. In this case n is less than the least stored count $n_0$ and the output of the comparator bank, N0 through N6, will be 0000000. Priority encoder 86 will determine the suitable state to compensate for the detected process variations. This will be the 3-bit control G2through G0 of 111 as indicated in Table 4. Returning to Table 1, it demonstrates that this 3-bit control value is combination 8, which reduces the effective resistance of the resistor networks $RN_1$, $RN_2$, and $RN_3$ by connecting all the switched resistors in parallel with the non-switched resistor in an effort to compensate for the detected process variations.

Note that the actual output frequency of oscillator 70 depends on process variations, which are measured in order to be able to compensate for such variations. Additionally, however, the actual output frequency of oscillator 70 also depends on the on-resistance and parasitics of those transistors that are enabled in response to the binary control code, L2 through L0 as shown in FIG. 8, applied to resistor network $RN_{osc}$ and capacitor network $CN_{osc}$. In other words the initial selection of the binary control code, L2 through L0, will affect the final 3-bit control, output by priority encoder 86, applied to filter 50 for tuning correction.

A 3-bit state machine 90 is implemented to generate the binary control code of oscillator 70, L2 through L0. State machine 90 starts with a middle initial condition. According to the sensed variation at the end of each calibration cycle $T_{ref}$, as detected by priority encoder 86, and the current state, state machine 90 will change the control code of oscillator 70 to a new state (i.e., new initial condition) in the direction of compensating for the sensed variation. In the present example, at most three calibration cycles (i.e., $3T_{ref}$) are required to converge to the correct tuning code, G2 through G0, as further detailed below relative to Table 4.

TABLE 4

| N6 | N5 | N4 | N3 | N2 | N1 | N0 | G2 | G1 | G0 |
|----|----|----|----|----|----|----|----|----|----|
| 0  | 0  | 0  | 0  | 0  | 0  | 0  | 1  | 1  | 1  |
| 0  | 0  | 0  | 0  | 0  | 0  | 1  | 1  | 1  | 0  |
| 0  | 0  | 0  | 0  | 0  | 1  | x  | 1  | 0  | 1  |
| 0  | 0  | 0  | 0  | 1  | x  | x  | 1  | 0  | 0  |
| 0  | 0  | 0  | 1  | x  | x  | x  | 0  | 1  | 1  |
| 0  | 0  | 1  | x  | x  | x  | x  | 0  | 1  | 0  |
| 0  | 1  | x  | x  | x  | x  | x  | 0  | 0  | 1  |
| 1  | x  | x  | x  | x  | x  | x  | 0  | 0  | 0  |

The 3-bit control code (i.e., G2 through G0) of priority encoder 86 is connected to a comparator 88, where comparator 88 also receives a 3-bit input from a state machine 90. Comparator 88 compares its two inputs and in response outputs a corresponding state of G (i.e., abbreviation of "greater than") to state machine 90, as further detailed below. Finally, state machine 90 outputs a three-bit control signal L0, L1, and L2 to oscillator 70, where that control signal is applied to resistor network $RN_{osc}$ and capacitor network $CN_{osc}$ to selectively enable/disable the transistors in those networks.

The operation of system 80 is now explored. In general, the operation of system 80 is controlled by state machine 90, To facilitate this discussion, the following Table 5 indicates the state flow for station machine 90.

TABLE 5

| G | Current State (L2, L1, L0) | | | Next State (L2, L1, L0) | | |
|---|---|---|---|---|---|---|
| 0 | 0 | 1 | 1 | 0 | 0 | 1 |
| 1 | 0 | 1 | 1 | 1 | 0 | 1 |
| 0 | 0 | 0 | 1 | 0 | 0 | 0 |
| 1 | 0 | 0 | 1 | 0 | 1 | 0 |
| 0 | 1 | 0 | 1 | 1 | 0 | 0 |
| 1 | 1 | 0 | 1 | 1 | 1 | 0 |

When RESET is asserted, state machine 90 begins by outputting L2, L1, and L0 equal to 011, as shown in the top data row of Table 5. From the earlier Table 1, one skilled in the art will appreciate that this first state therefore presents combination 4 of Table 1, which is an initial condition near the middle of frequency variance relative to the farther extremes that may be achieved using the different states for the control code L2, L1, and L0. In other words, the initial state represents only a −5% change from $f_{nominal}$ (and comparably could be the combination 5 binary state of 100 to represent a +5% change).

Also, once RESET is asserted, then counter 82 counts each cycle output by oscillator 70 and this count continues for a period of time equal to $T_{ref}$. In the preferred embodiment, $T_{ref}$ is considerably longer than the expected period of one cycle from oscillator 70; for example, for a one percent error, assume that $T_{ref}$ is one hundred times longer than the expected period of one cycle from oscillator 70. Accordingly, if the actual output frequency of oscillator 70 is equal to its expected frequency, that at the end of $T_{ref}$ counter 82 should contain a count equal to one hundred. However, due to process variations, environmental factors, and further due to the on-resistance of those transistors that are enabled in response to the binary 011 control code as well as the overall parasitic capacitance arising from the operations state in response to the 011 code, then the actual number of cycles of oscillator 70 may be different than the anticipated one hundred cycles. In view of this possibility, comparator bank 84 evaluates the number of counts in counter 82 as of $T_{ref}$ by comparing the actual count relative to the various different counts in each of its comparators, with the corresponding outputs of each of those comparators to priority encoder 86. In response, and according to the values set forth in Table 4, priority encoder 86 outputs a three-bit code G2 through G0 that represents the suitable correction bits needed to compensate for the measured process variation, that is, to bring the actual count toward the anticipated count. In other words, in view of the preceding, two different possibilities exist: (1) the actual count will match the expected count, in which case priority encoder 86 will output the same code as is currently being output by state machine 90 (i.e., the code which caused oscillator 70 to oscillate at the frequency just counted); or (2) the actual count will be greater or less than expected count, in which case priority encoder 86 will output a different code as is currently being output by state machine 90. Each of these alternatives is explored below.

In the case when the actual count in counter 82 matches the expected count, then recall that priority encoder 86 will output the same code as is currently being output by state machine 90. Thus, in this case, comparator 88 compares the 3-bit code from priority encoder-86 with the 3-bit code from state machine 90, and it determines that the codes match. In response, comparator 88 asserts the STOP signal which freezes the operation of oscillator 70 and counter 82 (or alternatively which could stop state machine 90 from changing state). At this point, the method just-described has determined that the present 3-bit code L0, L1, and L2 output by state machine 90 which matches the 3-bit code from priority encoder 86 G0, G1, and G2, caused oscillator 70 to oscillate at the expected frequency. In other words, the counted frequency is what was expected, meaning the factors that might cause a variance are not currently present and the present state of L0, L1, and L2, as output by state machine 90, represent an acceptable tuning for resistor network $RN_{osc}$ and capacitor network $CN_{osc}$. Further, because these networks were constructed subject to the same variations as the resistor networks $RN_1$ through $RN_3$ and capacitor networks $CN_2$ and $CN_3$ of filter 50, and because those networks are presently exposed to the same environmental factors (e.g., temperature) as are the comparable networks in oscillator 70, then it is presumed that the present state of L0, L1, and L2, having provided an acceptable tuning for oscillator 70, also would provide an acceptable tuning for filter 50. In response, therefore, until the time of the next assertion of the RESET signal in system 80, the states at the output of priority encoder 86, which matches those at the output of state machine 90, are used for tuning the resistor and capacitor networks in filter 50.

In the case when the actual count in counter 82 does not match the expected count, then recall that priority encoder 86 will output a different code as is currently being output by state machine 90. Thereafter, comparator 88 compares the 3-bit code from priority encoder 86 with the 3-bit code from state machine 90 and, thus, it determines that the codes do not match. Further, comparator 88 sets the state of G, where the state of G indicates which of the two inputs to comparator 88 is greater. Specifically, if the input from priority encoder 86 is less than the input from state machine 90, then G is a binary 0, whereas if the input from priority encoder 86 is greater than the input from state machine 90, then G is a binary 1. Thereafter, the value of G as well as the present state of the output of state machine 90 determine the next state of L2:L0 of state machine 90. To further appreciate the two alternative possibilities arising from the values of G, each is discussed in an example below.

As a first example to demonstrate the effect of the value of G, assume that the count in counter 82, after the expiration of $T_{ref}$, is greater than the expected count. For example, assume that the expected count equals a decimal value of 100 and the actual count equals a decimal value of 120. Further assume that the initial state, as output by state machine 90, is the middle code (i.e. L2, L1, and L0 is equal to 011). In this case, the values N6 through N0 output be comparator bank 84 indicate the level of the actual count 120 as it will be relative to the various counts in bank 84, and priority encoder 86 operates to output G2 through G0 according to Table 4 for a proposed correction to compensate for the measured variation, as reflected in the decimal count of 120. For the current situation, and according to Table 4, the output of priority encoder 86 is less than the output form state machine 90 (011). As a result, comparator 88 issues the state of G as a binary 0. Looking to Table 5, therefore, in response to G=0 and from the first state, the next state of L2:L0 output by state machine 90 is a binary 001. Accordingly, the new binary value of 001 is applied to oscillator 70. Returning to Table 1, it demonstrates that this newer binary value is combination 2, which reduces the nominal frequency of $v_{osc}$ to a greater extent than it was during the previous state of state machine 90. During this reduction, counter 82 is reset and for a second $T_{ref}$ it counts the number of cycles, with the operation of comparator bank 84 and priority encoder 86 repeating generally in a comparable manner as described above relative to the first binary state of 001. At the end of the second $T_{ref}$, comparator 88 again compares the outputs of priority encoder 86 and state machine 90. If those outputs match, then as before the STOP signal is asserted, thereby freezing oscillator 70 and counter 82, as well as the output of state machine 90, and so that the state output of priority encoder 86 may be applied to filter 50. Alternatively, if there is still a mis-match between the outputs of priority encoder 86 and state machine 90, then priority encoder 86 outputs a different 3-bit code than that currently being output by state machine 90. Thus, G is set accordingly and a next state is assumed by state machine 90 according to Table 5; thereafter, for a final time, counter 82 is reset and for a third $T_{ref}$ it counts the cycles output by oscillator 70. The preceding description will then repeat a third and final time to converge on the state, as output by state machine 90, that causes the adjusted frequency of oscillator 70 to approach or match its expected frequency.

As a second example to demonstrate the effect of the value of G, assume that the count in counter 82, after the expiration of $T_{ref}$, is less than the expected count. For example, assume that the expected count equals a decimal value of 100 and the actual count equals a decimal value of 80. Further assume that the initial state, as output by state machine 90, is the middle code (i.e. L2, L1, and L0 is equal to 011). In this case, the values N6 through N0 output by comparator bank 84 indicate the level of the actual count 80 as it will be relative to the various counts in bank 84, and priority encoder 86 operates to output G2 through G0 according to Table 4 for a proposed correction to compensate for the measured variation, as reflected in the decimal count of 80. For the current situation, and according to Table 4, the output of priority encoder 86 is less than the output form state machine 90 (011). As a result, comparator 88 issues the state of G as a binary 1. Looking to Table 4, therefore, in response to G=1 and from the first state, the next state output of L2:L0 by state machine 90 is a binary 101. Accordingly, the new binary value of 101 is applied to oscillator 70. Returning to Table 1, it demonstrates that this newer binary value is combination 6, which increases the nominal frequency of $v_{osc}$ to a greater extent than it was reduced during the previous state of state machine 90. During this increase, counter 82 is reset for a second $T_{ref}$ and it counts the number of cycles during $T_{ref}$, with the operation of comparator bank 84 and priority encoder 86 repeating generally in a comparable manner as described above relative to the first binary state of 101. At the end of the second $T_{ref}$, comparator 88 again compares the outputs of priority encoder 86 and state machine 90. If those outputs match, then as before the STOP signal is asserted, thereby freezing oscillator 70 and counter 82, as well as the output of priority encoder 86 so that its state also may be applied to filter 50. Alternatively, if there is still a mis-match between the outputs of priority encoder 86 and state machine 90, then priority encoder 86 outputs a different 3-bit code than that currently being output by state machine 90. Thus, G is set accordingly and a next state is assumed by state machine 90 according to Table 4; thereafter, for a final time, counter 82 is reset and for a third $T_{ref}$ it counts the cycles output by oscillator 70. Thereafter, the preceding description will repeat a third and final time to converge on the state, as output by state machine 90, that causes the adjusted frequency of oscillator 70 to approach or match its expected frequency.

From the above, it may be appreciated that the above embodiments provide a filter that is tunable in response to a set of control codes, where the preferred embodiments further include an oscillator structure and method for determining an optimal set of those control codes. The tuning of the filter is preferably adjusted each time the filter circuit is reset and, thus, such tuning may compensate for manufacturing variations as well as subsequent environmental changes that may occur between successive resets of the filter. In addition, preferably the tuning control codes are applied to both resistor and capacitor networks within the filter, where the resistor networks are tuned to provide coarse adjustment of the filter frequency and the capacitor networks are tuned to provide fine adjustment of the filter frequency. Still further, with respect to each network, it includes switching transistors that have a non-negligible on-resistance, and comparable network configurations are included within the oscillator so that the non-negligible on-resistance is accounted for in determining the optimal set of control codes; in other words, the non-negligible on-resistance of the tuning transistors is part of the overall RC product in the filter, and by including the same structure in the oscillator that non-negligible on-resistance is necessarily factored into the determination of the tuning strategy for the corresponding filter. As a result of these aspects, the preferred embodiments provide numerous technical advantages. For example, the preferred filter is suitable for many high frequency applications. As another example, while the preferred filter is tunable, it maintains a considerably linear operation. As another example, the tuning of the filter permits compensation for various parasitics that are introduced to the filter by the tuning elements and which could otherwise affect the filter. As still another example, the various aspects described above are achieved without requiring unacceptably large transistors and without demanding unacceptably large drive current.

In addition to the above benefits, another aspect is that while the present embodiments have been described in detail, various substitutions, modifications or alterations could be made to the descriptions set forth above without departing from the inventive scope. For example, while a Sallen-Key filter is shown as the preferred embodiment, other embodiments may be formed by applying the present inventive teachings to other filters, including low pass, high pass, and bandpass filters. As another example, the present inventive teachings may apply to single output amplifiers in addition to a differential output amplifier as in the illustrated case. As still another example, while the preferred embodiments include both resistor and capacitor networks, alternative embodiments may be constructed using only one or the other of these types of network. As yet a final example, the number of elements in these networks may be adjusted as may be the number of switched elements versus non-switched elements, such as (i) multiple resistors to form a combined resistance in locations where single resistors are shown; and (ii) multiple capacitors to form a combined capacitance in locations where single capacitors are shown. Accordingly, the preceding teachings and examples all further demonstrate the inventive scope, as is defined by the following claims.

What is claimed is:

1. An integrated circuit comprising a filter, the filter comprising:
   a first resistor network having a first lead coupled to receive an input signal and a second lead coupled to a first lead of a second resistor network;
   a first capacitor having a first lead coupled to said first lead of said second resistor network and a second lead coupled to a first lead of a transistor;
   a first capacitor network having a first lead coupled to a second lead of said second resistor network and to a control lead of said transistor, a second lead of said first capacitor network coupled to a second lead of said transistor;
   wherein said first resistor network comprises a non-switched resistor and a switched resistor connected in parallel with said non-switched resistor, said non-switched resistor and said switched resistor coupling said first lead of said first resistor network to said second lead of said first resistor network;
   wherein said switched resistor comprises a switching transistor coupled in series with a resistor between said first lead of said first resistor network and said second lead of said first resistor network;
   wherein said switching transistor, when enabled or switched on, electrically connects said resistor between said first lead of said first resistor network and said second lead of said first resistor network;
   wherein said switching transistor, when enabled or switched on, adds resistance in series to the resistance provided by said resistor;
   wherein the overall resistance of said switched resistor is calculated to include the resistance of said resistor and the resistance of said switching transistor, when enabled or switched on; and
   wherein the resistance of said switching transistor, when enabled or switched on, is at least 20 percent of the overall resistance of said switched resistor.

2. The filter of claim 1, further including additional switched resistors each connected in parallel with said non-switched resistor and said switched resistor of said first resistor network.

3. The filter of claim 1, wherein said switched resistor is enabled or turned on and disabled or turned off by a transistor.

4. The filter of claim 1, wherein the resistance of said resistor and the resistance of said switching transistor, when enabled or switched on, is approximately the same.

5. The filter of claim 1, wherein said switching transistor is a PMOS transistor designed to operate in its linear region.

6. The filter of claim 1, wherein the resistance of said non-switched resistor is lower than the resistance of said switched resistor when said switched resistor is enabled or switched on.

7. The filter of claim 2, wherein the resistance of each of said additional switched resistors is higher than the resistance of said non-switched resistor.

8. The filter of claim 2, wherein each of said additional switched resistors is enabled or switched on and disabled or switched off by a respective switching transistor.

9. The filter of claim 8, wherein each of said additional switched resistors comprises a respective switching transistor coupled in series with a resistor between said first lead of said first resistor network and said second lead of said first resistor network.

10. The filter of claim 9, wherein the physical size of said respective switching transistor in said switched resistor is larger the physical size of any of said respective switching transistors used to switch said additional switched resistors.

11. The filter of claim 1, wherein said second resistor network comprises a non-switched resistor and a switched resistor connected in parallel with said non-switched resistor of said second resistor network, said non-switched resistor of said second resistor network and said switched resistor of said second resistor network coupling said first lead of said second resistor network to said second lead of said second resistor network.

12. The filter of claim 11, further including an additional switched resistor connected in parallel with said non-switched resistor of said second resistor network and said switched resistor of said second resistor network.

13. The filter of claim 11, wherein said switched resistor of said second resistor network is enabled or switched on and disabled or switched off by a switching transistor.

14. The filter of claim 11, wherein said switched resistor of said second resistor network comprises a switching transistor coupled in series with a resistor between said first lead of said second resistor network and said second lead of said second resistor network.

15. The filter of claim 14, wherein said switching transistor of said second resistor network, when enabled or switched on, electrically connects said resistor of said second resistor network between said first lead of said second resistor network and said second lead of said second resistor network.

16. The filter of claim 15, wherein said switching transistor of said second resistor network, when enabled or switched on, adds resistance in series to the resistance provided by said resistor of said second resistor network.

17. The filter of claim 16, wherein an overall resistance of said switched resistor of said second resistor network is calculated to include the resistance of said resistor of said second resistor network and the resistance of said switching transistor of said second resistor network, when enabled or switched on.

18. The filter of claim 17, wherein the resistance of said switching transistor of said second resistor network, when enabled or switched on, is at least 20 percent of the total resistance of said switched resistor of said second resistor network.

19. The filter of claim 17, wherein the resistance of said resistor of said second resistor network and the resistance of said switching transistor of said second resistor network, when enabled or switched on, is approximately the same.

20. The filter of claim 14, wherein said switching transistor of said second resistor network is a PMOS transistor designed to operate in its linear region.

21. The filter of claim 17, wherein the resistance of said non-switched resistor of said second resistor network is lower than the resistance of said switched resistor of said second resistor network when said switched resistor is enabled or switched on.

22. The filter of claim 12, wherein said second resistor network further includes additional switched resistors each connected in parallel with said non-switched resistor and said switched resistor of said second network, and wherein the resistance of each of said additional switched resistors of said second resistor network is higher than the resistance of said switched resistor of said second resistor network.

23. The filter of claim 12, wherein each of said additional switched resistors of said second resistor network is enabled or switched on and disabled or switched off by a respective switching transistor.

24. The filter of claim 23, wherein each of said additional switched resistors of said second resistor network comprise a switching transistor coupled in series with a resistor between said first lead of said second resistor network and said second lead of said second resistor network.

25. The filter of claim 24, wherein a physical size of each of said switching transistors in said additional switched resistors of said second resistor network is smaller than a physical size of said switching transistor used to switch a resistor in said switched resistor of said second resistor network.

26. The filter of claim 1:
wherein said second lead of said first capacitor is further coupled to a first lead of a third resistor network; and
wherein said third resistor network comprises a non-switched resistor and a switched resistor connected in parallel with said non-switched resistor, said non-switched resistor and said switched resistor coupling said first lead of said third resistor network to a second lead of said third resistor network.

27. The filter of claim 26, further including additional switched resistors each connected in parallel with said non-switched resistor resistors of said second resistor network and said switched resistor of said third resistor network.

28. The filter of claim 26, wherein said switched resistor of said third resistor network is enabled or switched on and disabled or switched off by a switching transistor.

29. The filter of claim 26, wherein said switched resistor of said third resistor network comprises a switching transistor coupled in series with a resistor between said first lead of said third resistor network and said second lead of said third resistor network.

30. The filter of claim 29, wherein said switching transistor of said third resistor network, when enabled or switched on, electrically connects said resistor of said third resistor network between said first lead of said third resistor network and said second lead of said third resistor network.

31. The filter of claim 30, wherein said switching transistor of said third resistor network, when enabled or switched on, adds resistance in series to the resistance provided by said resistor of said third resistor network.

32. The filter of claim 31, wherein an overall resistance of said switched resistor of said third resistor network is calculated to include the resistance of said resistor of said third resistor network and the resistance of said switching transistor of said third resistor network, when enabled or switched on.

33. The filter of claim 32, wherein the resistance of said switching transistor of said third resistor network, when enabled or switched on, is at least 20 percent of the total resistance of said switched resistor of said third resistor network.

34. The filter of claim 32, wherein the resistance of said resistor of said third resistor network and the resistance of said switching transistor of said third resistor network, when enabled or switched on, is approximately the same.

35. The filter of claim 29, wherein said switching transistor of said third resistor network is a PMOS transistor designed to operate in its linear region.

36. The filter of claim 32, wherein the resistance of said non-switched resistor of said third resistor network is lower than the resistance of said switched resistor of said third resistor network when said switched resistor of said third resistor network is enabled or switched on.

37. The filter of claim 27, wherein the resistance of each of said additional switched resistors of said third resistor network is higher than the resistance of said switched resistor of said third resistor network.

38. The filter of claim 27, wherein each of said additional switched resistors of said third resistor network is enabled or switched on and disabled or switched off by a respective switching transistor.

39. The filter of claim 38, wherein each of said additional switched resistors of said third resistor network comprises a switching transistor coupled in series with a resistor between said first lead of said third resistor network and said second lead of said third resistor network.

40. The filter of claim 39, wherein a physical size of each of said switching transistors in said additional switched resistors of said third resistor network is smaller than a physical size of said switching transistor used to switch said resistor in said switched resistor of said third resistor network.

41. The filter of claim 1, wherein said first capacitor network comprises a non-switched capacitor and a switched capacitor connected in parallel with said non-switched capacitor, said non-switched capacitor and said switched capacitor coupling said first lead of said first capacitor network to said second lead of said first capacitor network.

42. The filter of claim 41, further including additional switched capacitors each connected in parallel with said non-switched capacitor and said switched capacitor of said first capacitor network.

43. The filter of claim 41, wherein said switched capacitor is enabled or switched on and disabled or switched off by a switching transistor.

44. The filter of claim 41, wherein said switched capacitor comprises a switching transistor coupled in series with a capacitor between said first lead of said first capacitor network and said second lead of said first capacitor network.

45. The filter of claim 44, wherein said switching transistor of said switched capacitor, when enabled or switched on, electrically connects said capacitor between said first lead of said first capacitor network and said second lead of said first capacitor network.

46. The filter of claim 42, wherein each of said additional switched capacitors is enabled or switched on and disabled or switched off by a respective switching transistor.

47. The filter of claim 42, wherein each of said additional switched capacitors comprises a respective switching transistor coupled in series with a capacitor between said first lead of said first capacitor network and said second lead of said first capacitor network.

48. The filter of claim 45, wherein said switching transistor of said switched capacitor, when enabled or switched on, electrically connects said capacitor between said first lead of said first capacitor network and said second lead of said first capacitor network.

49. The filter of claim 45, wherein said switching transistor of said switched capacitor is a PMOS transistor designed to operate in its linear region.

50. The filter of claim 41, wherein the capacitance of said non-switched capacitor is higher than the capacitance of said switched capacitor when said capacitor is enabled or switched on.

51. The filter of claim 46, wherein the capacitance of each of said additional switched capacitors is lower than the capacitance of said switched capacitor and lower than the capacitance of said non-switched capacitor.

52. The filter of claim 1:
wherein said second lead of said first capacitor network is further coupled to a first lead of a second capacitor network; and
wherein said second capacitor network comprises a non-switched capacitor and a switched capacitor connected in parallel with said non-switched capacitor, said non-switched capacitor and said switched capacitor coupling said first lead of said second capacitor network to a second lead of said second capacitor network.

53. The filter of claim 52, further including additional switched capacitors each connected in parallel with said non-switched capacitor and said switched capacitor of said second capacitor network.

54. The filter of claim 52, wherein said switched capacitor is enabled or switched on and disabled or switched off by a switching transistor.

55. The filter of claim 54, wherein said switched capacitor comprises a switching transistor coupled in series with a capacitor between said first lead of said second capacitor network and said second lead of said second capacitor network.

56. The filter of claim 55, wherein said switching transistor, when enabled or switched on, electrically connects said capacitor between said first lead of said second capacitor network and said second lead of said second capacitor network.

57. The filter of claim 53, wherein each of said additional switched capacitors is enabled or switched on and disabled or switched off by a transistor.

58. The filter of claim 57, wherein each of said additional switched capacitors comprise a respective switching transistor coupled in series with a capacitor between said first lead of said second capacitor network and said second lead of said second capacitor network.

59. The filter of claim 58, wherein each of said respective switching transistors associated with a respective additional switched capacitor, when enabled or switched on, electrically connects a respective capacitor between said second lead of said first capacitor network and said second lead of said second capacitor network.

60. The filter of claim 59, wherein each of said respective switching transistors associated with said switched capacitors is a PMOS transistor designed to operate in its linear region.

61. The filter of claim 52, wherein the capacitance of said non-switched capacitor is higher than the capacitance of said switched capacitor when said capacitor is enabled or switched on.

62. The filter of claim 53, wherein the capacitance of each of said additional switched capacitors is lower than the capacitance of said non-switched capacitor.

63. The filter of claim 53, wherein each of said additional switched capacitors is switched on and off by a transistor.

64. The filter of claim 53, wherein each of said additional switched capacitors comprise a transistor coupled in series with a capacitor between said first lead of said second capacitor network and said second leaf of said second capacitor network.

65. The filter of claim 1, further including a reference voltage coupled to said first lead of said transistor.

66. The filter of claim 1, further including a biasing circuit coupled to said second lead of said transistor.

67. The filter of claim 1, wherein said first lead of said transistor produces an output signal having a frequency cutoff point.

68. The filter of claim 67, wherein said output produces an output signal having a frequency cutoff point that is adjustable in response to a control signal being sent to said control lead of said switching transistor in said switched resistor.

69. The filter of claim 8:
wherein said first lead of said transistor produces an output signal having a frequency cutoff point;
wherein said output produces an output signal having a frequency cutoff point that is adjustable in response to a control network being sent to said control lead of said switching transistor in said switched resistor; and
wherein said output produces an output signal having a frequency cutoff point that is further adjustable in response to additional control signals being sent to said control leads of said respective switching transistors in said additional switched resistors.

70. The filter of claim 14:
wherein said first lead of said transistor produces an output signal having a frequency cutoff point; and
wherein said output produces an output signal having a frequency cutoff point that is adjustable in response to a control signal being sent to said control lead of said switching transistor in said switched resistor of said second resistor network.

71. The filter of claim 24:
wherein said first lead of said transistor produces an output signal having a frequency cutoff point;
wherein said output produces an output signal having a frequency cutoff point that is adjustable in response to a control signal being sent to said control lead of said switching transistor in said switched resistor of said second resistor network; and
wherein said output produces an output signal having a frequency cutoff point that is further adjustable in response to additional control signals being sent to said control leads of said switching transistors in said additional switched resistors of said second resistor network.

72. The filter of claim 29:
wherein said second lead of said third resistor network produces an output signal having a frequency cutoff point; and
wherein said output produces an output signal having a frequency cutoff point that is adjustable in response to a control signal being sent to said control lead of said switching transistor in said switched resistor of said third resistor network.

73. The filter of claim 39:
wherein said second lead of said third resistor network produces an output signal having a frequency cutoff point;
wherein said output produces an output signal having a frequency cutoff point that is adjustable in response to a control signal being sent to said control lead of said switched transistor in said switched resistor of said third resistor network; and
wherein said output produces an output signal having a frequency cutoff point that is further adjustable in response to additional control signals being sent to said control leads of said switching transistors in said additional switched resistors of said third resistor network.

74. The filter of claim 44:
wherein said first lead of said transistor produces an output signal having a frequency cutoff point; and
wherein said output produces an output signal having a frequency cutoff point that is adjustable in response to a control signal being sent to said control lead of said switching transistor in said switched capacitor.

75. The filter of claim 53:
wherein said second lead of said second capacitor network produces an output signal having a frequency cutoff point; and
wherein said output produces an output signal having a frequency cutoff point that is further adjustable in response to additional control signal being sent to said control leads of said additional switched capacitors.

76. The filter of claim 1, wherein tuning control codes are applied to both resistor and capacitor networks within said filter, said resistor networks being tuned to provide coarse adjustment of filter frequency and said capacitor networks being tuned to provide fine adjustment of said filter frequency.

* * * * *